(12) United States Patent
Sakai et al.

(10) Patent No.: US 7,005,685 B2
(45) Date of Patent: Feb. 28, 2006

(54) GALLIUM-NITRIDE-BASED COMPOUND SEMICONDUCTOR DEVICE

(75) Inventors: Shiro Sakai, 174-4 Nakatsu-ura, Hachiman-cho, Tokushima-shi, Tokushima 770-8072 (JP); Yoshiki Naoi, Tokushima (JP); Masashi Tsukihara, Tokushima (JP)

(73) Assignees: Shiro Sakai, Tokushima (JP); Nitride Semiconductors Co., Ltd., Tokushima (JP)

( * ) Notice: Subject to any disclaimer, the term of this patent is extended or adjusted under 35 U.S.C. 154(b) by 241 days.

(21) Appl. No.: 10/376,551

(22) Filed: Feb. 28, 2003

(65) Prior Publication Data

US 2003/0222266 A1 Dec. 4, 2003

(30) Foreign Application Priority Data

| Feb. 28, 2002 | (JP) | ................................ 2002-053684 |
| Mar. 27, 2002 | (JP) | ................................ 2002-090052 |
| Jul. 29, 2002 | (JP) | ................................ 2002-220101 |

(51) Int. Cl.
*H01L 33/00* (2006.01)

(52) U.S. Cl. .................... 257/103; 257/190; 257/97; 372/45

(58) Field of Classification Search ............ 257/103, 257/97, 190; 372/45

See application file for complete search history.

(56) References Cited

U.S. PATENT DOCUMENTS

| 3,909,929 | A |   | 10/1975 | Debesis ................... 29/590 |
| 5,274,251 | A | * | 12/1993 | Ota et al. ................ 257/78 |

(Continued)

FOREIGN PATENT DOCUMENTS

| EP | 0 180 222 A2 | 8/1980 |
| EP | 0 180 222 A3 | 5/1986 |
| EP | 0 723 303 A3 | 7/1996 |

(Continued)

OTHER PUBLICATIONS

S. Sakai et al.; "A new method of reducing dislocation density in GaN layer grown on sapphire substrate by MOVPE"; Journal of Crsytal Growth 221 (2000) pp 334–337.

Kikuo Tominaga et al.; "Preparation of conductive ZnO:A1 films by a facing target system with a strong magnetic field"; Thin Solid Films 253 (1994) pp. 9–13.

Notice of Grounds for Rejection for Patent Application Ser. No. JP–2002–220101 dated Aug. 3, 2004, 2 pages.

esp@cenet—Abstract of JP10270804 published Oct. 9, 1998, 1 page.

(Continued)

*Primary Examiner*—Jerome Jackson

(57) ABSTRACT

A GaN-based compound semiconductor device formed by sequentially forming, on a substrate, a GaN-based buffer layer and a GaN-based compound semiconductor layer. $Al_xGa_{1-x}N_{1-y}P_y$ or $Al_xGa_{1-x}N_{1-y}As_y$ ($0 \leq x \leq 1$, $0 < y < 1$) is used as the GaN-based buffer layer. N in $Al_xGa_{1-x}N$ is partially substituted by P or As, whereby a buffer layer is grown at a high temperature. Thus, a difference in processing temperature between the process for growing a buffer layer and processes before and after the process is reduced. The GaN-based compound semiconductor layer formed on the buffer layer comprises a GaN-based layer, an n-type clad layer, a light-emitting layer, and a p-type clad layer. A multiple quantum well (MQW) layer formed from GaNP or GaNAs and GaN is inserted between the GaN-based layers, thereby reducing a dislocation density of the GaN-based layers.

16 Claims, 14 Drawing Sheets

U.S. PATENT DOCUMENTS

| | | | |
|---|---|---|---|
| 5,332,697 A | 7/1994 | Smith et al. ................. | 437/242 |
| 5,429,954 A | 7/1995 | Gerner | |
| 5,633,192 A | 5/1997 | Moustakas et al. | |
| 5,652,438 A | 7/1997 | Sassa et al. | |
| 5,717,226 A | 2/1998 | Lee et al. ..................... | 257/86 |
| 5,767,581 A | 6/1998 | Nakamura et al. .......... | 257/749 |
| 5,786,233 A | 7/1998 | Taskar et al. ................. | 438/46 |
| 5,787,104 A | 7/1998 | Kamiyama et al. | |
| 5,804,918 A | 9/1998 | Yazawa et al. .............. | 313/506 |
| 5,874,747 A | 2/1999 | Redwing et al. ............. | 257/77 |
| 5,880,485 A | 3/1999 | Marx et al. | |
| 5,888,886 A | 3/1999 | Sverdlov et al. ............ | 438/505 |
| 5,900,650 A | 5/1999 | Nitta .......................... | 257/94 |
| 5,929,466 A | 7/1999 | Ohba et al. .................. | 257/103 |
| 6,030,848 A | 2/2000 | Yuge et al. ................... | 438/46 |
| 6,090,666 A | 7/2000 | Ueda et al. .................. | 438/257 |
| 6,103,604 A | 8/2000 | Bruno et al. ................. | 438/584 |
| 6,172,382 B1 | 1/2001 | Nagahama et al. .......... | 257/94 |
| 6,191,436 B1 | 2/2001 | Shibata et al. ............... | 257/91 |
| 6,242,328 B1 | 6/2001 | Shin ........................... | 438/518 |
| 6,261,862 B1 | 7/2001 | Hori et al. ................... | 438/96 |
| 6,277,665 B1 | 8/2001 | Ma et al. | |
| 6,303,473 B1 * | 10/2001 | Heffernan et al. .......... | 438/483 |
| 6,355,945 B1 | 3/2002 | Kadota et al. ................ | 257/82 |
| 6,399,966 B1 * | 6/2002 | Tsuda et al. ................. | 257/103 |
| 6,423,984 B1 | 7/2002 | Kato et al. ................... | 257/103 |
| 6,455,337 B1 | 9/2002 | Sverdlov ..................... | 438/22 |
| 6,465,808 B1 | 10/2002 | Lin .............................. | 257/81 |
| 6,466,597 B1 * | 10/2002 | Kume et al. .................. | 372/45 |
| 6,586,779 B1 | 7/2003 | Tsuda et al. | |
| 2002/0036286 A1 | 3/2002 | Ho et al. ...................... | 257/11 |
| 2002/0042159 A1 | 4/2002 | Chiyo et al. .................. | 438/46 |
| 2002/0043890 A1 | 4/2002 | Lu et al. ................. | 310/313 D |
| 2004/0026704 A1 | 2/2004 | Nikolaev et al. | |
| 2004/0051105 A1 | 3/2004 | Tsuda et al. | |

FOREIGN PATENT DOCUMENTS

| | | |
|---|---|---|
| EP | 0 723 303 A2 | 7/1996 |
| EP | 0 731 490 A3 | 9/1996 |
| EP | 0 731 490 A2 | 9/1996 |
| EP | 0 779 666 A2 | 6/1997 |
| EP | 0 942 459 A1 | 9/1999 |
| EP | 0 961 328 A2 | 12/1999 |
| JP | 4-297023 | 10/1992 |
| JP | 6-291366 | 10/1994 |
| JP | 8-97469 | 4/1996 |
| JP | 9-17975 | 1/1997 |
| JP | 9-227298 | 9/1997 |
| JP | 10-22568 | 1/1998 |
| JP | 10-163525 | 6/1998 |
| JP | 10270804 | 10/1998 |
| JP | 10-312971 | 11/1998 |
| JP | 10-321913 | 12/1998 |
| JP | 11-68256 | 3/1999 |
| JP | 11-74560 | 3/1999 |
| JP | 11-111867 | 4/1999 |
| JP | 11-135832 | 5/1999 |
| JP | 11-145057 | 5/1999 |
| JP | 11-145516 | 5/1999 |
| JP | 11-266004 | 9/1999 |
| JP | 11-330547 | 11/1999 |
| JP | 11-346032 | 12/1999 |
| JP | 11-346035 | 12/1999 |
| JP | 11-354839 | 12/1999 |
| JP | 11-354840 | 12/1999 |
| JP | 11-354842 | 12/1999 |
| JP | 2000-21789 | 1/2000 |
| JP | 2000-91252 | 3/2000 |
| JP | 2000-91253 | 3/2000 |
| JP | 2000-174344 | 6/2000 |
| JP | 2000-357820 | 12/2000 |
| JP | 2002084040 | 3/2002 |
| TW | 4-288871 | 8/1993 |
| WO | WO 98/42030 | 9/1998 |
| WO | WO 98/44569 | 10/1998 |

OTHER PUBLICATIONS esp@cenet—Abstract of JP2002084040 published Mar. 22, 2002, 1 page.
Patent Abstracts of Japan, publication no. 11135832A, published May 21, 1999 (1 pg).
Patent Abstracts of Japan, publication no. 11145057A, published May 28, 1999 (1pg).
Patent Abstracts of Japan, publication no. 11145516A, published May 28, 1999 (1 pg).
Patent Abstracts of Japan, publication no. 11346032A, published Dec. 14, 1999 (1 pg).
Patent Abstracts of Japan, publication no. 11346035A, published Dec. 14, 1999 (1 pg).
Patent Abstracts of Japan, publication no. 2000091252A, published Mar. 31, 2000 (1 pg).
Patent Abstracts of Japan, publication no. 2000357820A, published Dec. 26, 2000 (1 pg).
ESP@cenet Abstract No. EP0497350, published Aug. 5, 1992 (1 pg).
Nakamura et al.; "InGaN/GaN/AlGaN–based laser diodes with modulation–doped strained–layer superlattices grown on an epitaxially laterally overgrown GaN substrate"; Appl. Phys. Lett. 72(2), Jan. 12, 1998, 1998 American Institute of Physics; pp 211–213.
Kellet et al.; "Influence of sapphire nitridation on properties of gallium nitride grown by metalorganic chemical vapor deposition"; Appl. Phys. Lett. 68(11), Mar. 11, 1996, 1996 American Institute of Physics; pp 1525–1527.
Haffouz et al.; The Effect of theSi/N treatement of a nitridated sapphire surface on the growth mode of GaN in low–pressure metalorganic vapor phase epitaxy; Applied Physics Letters, vol. 73, No. 9, Aug. 31, 1998, pp. 1278–1280.
Haffouz et al.; "Optimization of Si/N Treatment Time of Sapphire Surface and Its Effect on the MOVPE GaN Overlayers"; Phys. stat. sol. pp 677–681, Jul. 4, 1999.
P. Vennegues et al.; "Influence of in situ sapphire surface preparation and carrier gas on the growth mode of GaN in MOVPE"; Journal of Crystal Growth 187 (1998) pp 169–177.
Japanese Office Action dated May 25, 2004, along with English translation (4 pages).
English Abstract of Japanese Publication No. 11–74560 (1 page).
English Abstract of Japanese Publication No. 8–97469 (1 page).
English Abstract of Japanese Publication No. 11–330547 (1 page).
Japanese Patent Application Ser. No. 2000–358412 Office Action dated May 27, 2003.
U.S. Appl. No. 10/139,863 Office Action dated May 23, 2003.
H. Lahreche et al.l "Growth of high–quality GaN by low–pressure metal–organic vapour epitaxy (LP–MOVPE) from 3D islands and lateral overgrowth"; Journal of Crystal Growth 205 (1999) pp 245–252.
Japanese Patent Application Serial No. 091100294 Office Action dated Mar. 14, 2003.

Japanese Patent Application No. 2000–289103 Office Action dated Apr. 22, 2003.

Patent Abstracts of Japan; Publication No. 10242061, published Sep. 11, 1998 (1 pg.).

Patent Abstracts of Japan; publication no. 11186174, published Jul. 9, 1999 (1 pg).

Patent Abstracts of Japan, publication No. 11274557, published Oct. 8, 1999 (1 pg).

Patent Abstracts of Japan, publication No. 2000306854, published Nov. 2, 2000 (1 pg).

Patent Abstracts of Japan, publication no. 07097300, published Apr. 11, 1995 (1 pg).

Patent Abstracts of Japan, publication no. 10178213 published Jun. 30, 1998 (1 pg).

Patent Abstracts of Japan, publication No. 11111867, published Apr. 23, 1999 (1 pg).

Patent Abstracts of Japan, publication No. 11068256, published Mar. 9, 1999 (1 pg).

Hiramatsu et al.; "Fabrication and Characterization of Low Defect Density GaN Using Facet Controlled Epitaxial Lateral Overgrowth (FACELO)"; ICMOVPE–X 2000 (Workbook), The Tenth International Conference on Metalorganic Vapor Phase Epitaxy, Jun. 5–9, 2000, Sapporo, Japan, pp. 289–300.

Joseph et al.; "p–Type Electrical Conduction in ZnO Thin Films by Ga and N Codoping"; Jpn. J. Appl. Phys., vol. 38 (1999), L1205–L1207; Part 2, No. 11A, Nov. 1, 1999.

Takeuchi et al.; "Drastic reduction of the dislocation density in GaN films by anti–surfactant–mediated dot formation"; ICMOVPE–X 2000 (Workbook), The Tenth International Conference on Metalorganic Vapor Phase Epitaxy, Jun. 5–9, 2000, Sapporo, Japan.

Haffouz et al.; "The effect of the Si/N treatment of a nitridated sapphire surface on the growth mode of GaN in low–pressure metalorganic vapor phase epitaxy"; Applied Physics Letters, vol. 73, No. 9, Aug. 31, 1998, pp 1278–1280.

Japanese Patent Application Ser. No. 2000–227963 Office Actio dated Oct. 30, 2001.

Japanese Patent Application Serial No. 2000–164349 Office Action dated Oct. 23, 2001.

ESP@cenet Abstract No. , publication No. 10312971, published Nov. 24, 1998, (1 pg).

ESP@cenet Abstract No., publication No. 2000021789, published Jan. 21, 2000 (1 pg).

ESP@cenet Abstract No., publication No. 11354839, published Dec. 24, 1999 (1 pg).

ESP@cenet Abstract No. publication No. 11354840, published Dec. 24, 1999 (1 pg).

ESP@cenet Abstract No. publication No. 11354842, published Dec. 24, 1999 (1 pg).

ESP@cenet Abstract No. US6177684, published Jan. 23, 2001 (1 pg).

Patent Abstracts of Japan, publication No. 09227298A, published Sep. 2, 1997 (1 pg).

Patent Abstracts of Japan, publication No. 10022568A, published Jan. 23, 1998 (1 pg).

* cited by examiner

GALLIUM-NITRIDE-BASED COMPOUND SEMICONDUCTOR DEVICE

BACKGROUND OF THE INVENTION

1. Field of the Invention

The present invention relates to a gallium-nitride (GaN)-based semiconductor device and a method for manufacturing the same, and more particularly, to a layer system of the semiconductor device.

2. Related Art

Application of a GaN-based compound semiconductor to a short-wave LED (light-emitting diode) and a short-wave LD (laser diode) has been considered. In order to manufacture a GaN device, a GaN crystal must be grown on a crystal substrate, such as sapphire, which differs in lattice constant from GaN. In a known method, a buffer layer made of GaN, AlGaN, or AlN is formed to a thickness of about 20 to 30 nm at a temperature as low as about 500° C. and subsequently a GaN layer is grown at a temperature of about 1050° C. by increasing the temperature.

A GaN layer can be grown on a substrate through use of a low-temperature buffer layer. However, before growth of a low-temperature buffer layer, a substrate is usually subjected to heat treatment at a high temperature of 1100° C. or more. Therefore, a growth process becomes complicated; namely, the growth process involves the steps of heating a substrate to 1100° C., lowering the temperature; growing a buffer layer at 500° C., raising the temperature, and growing a GaN layer at 1050° C. Particularly, a step of lowering the temperature from 1100° C. to 500° C. requires considerable time, and hence manufacture of a GaN-based compound semiconductor device involves consumption of much time.

If a dislocation density of a light-emitting layer (i.e., an active layer) is high, aluminous efficiency of an LED is deteriorated, or a threshold oscillation current of an LD becomes high and the LD is deteriorated within a short period of time. For this reason, an epitaxial lateral overgrowth (ELO) method using a growth inhibition layer formed from $SiO_2$ is also known. Under the ELO method, a GaN layer is grown on a substrate such as sapphire by means of an MOCVD (metal-organic CVD) method. After the substrate has been removed from an MOCVD apparatus, a growth inhibition layer, such as $SiO_2$ or the like, is formed into a stripe pattern on the GaN layer by means of photolithography. Subsequently, the substrate is re-loaded into the MOCVD apparatus, and the GaN layer is again grown on the stripe-shaped growth inhibition layer. A GaN crystal starts growing on areas where no growth inhibition layer is formed and grows in both a thicknesswise direction and a lateral direction. No dislocations are transmitted to the GaN crystal that has laterally grown on the growth inhibition layer, and hence the dislocation density of the GaN crystal is restrained.

However, even under the ELO method, the growth inhibition layer must be formed through use of photolithography, thus requiring efforts. Moreover, the substrate must be removed from the MOCVD apparatus for forming the growth inhibition layer and then loaded into the MOCVD apparatus, and hence the surface of the substrate is vulnerable to contamination.

SUMMARY OF THE INVENTION

The invention provides a high-quality GaN-based compound semiconductor device which can be manufactured efficiently.

The GaN-based compound semiconductor device of the invention comprises a substrate, a GaN-based buffer layer formed on the substrate, and a GaN-based compound semiconductor layer formed on the GaN-based buffer layer. The GaN-based buffer layer comprises $Al_xGa_{1-x}N_{1-y}P_y$ or $Al_xGa_{1-x}N_{1-y}As_y$ ($0 \leq x \leq 1$, $0 < y < 1$). A growth temperature of the GaN-based buffer layer is increased through use, as a GaN-based buffer layer, of a material formed by partially substituting N in the GaN-based buffer layer with P or As.

In an embodiment of the invention, the GaN-based buffer layer and the GaN-based compound semiconductor layer are formed at a temperature of about 1000° C. Specifically, the GaN-based buffer layer is formed at a temperature higher than that employed in a conventional manufacturing method.

In another embodiment of the invention, The GaN-based compound semiconductor layer comprises a GaN-based layer formed on the GaN-based buffer layer, a GaN-based clad layer of first conductivity type formed on the GaN-based layer, a light-emitting layer formed on the GaN-based clad layer of first conductivity type, and a GaN-based clad layer of second conductivity type formed on the light-emitting layer. A light-emitting device, such as an LED, is obtained by means of such a construction.

The GaN-based compound semiconductor device of the invention comprises a substrate, a GaN-based buffer layer formed on the substrate, a first GaN-based layer formed on the GaN-based buffer layer, a multiple quantum well (MQW) layer formed by alternately stacking $GaN_{1-y}P_y$ or $GaNAs$ ($0 < y < 1$) and GaN, and a second GaN-based layer formed on the MQW layer. Dislocations of the GaN-based layer are terminated by means of inserting an MQW layer formed from GaNP (or GaNAs) and GaN between the GaN-based layers.

In the embodiment of the invention, the GaN-based compound semiconductor further comprises a GaN-based clad layer of first conductivity type formed on the second GaN-based layer, a GaN-based light-emitting layer formed on the GaN-based clad layer of first conductivity type, and a GaN-based clad layer of second conductivity type formed on the GaN-based light-emitting layer. By means of such a construction, a light-emitting device, such as an LED, is obtained.

The invention will be more clearly comprehended by reference to the embodiments provided below. However, the scope of the invention is not limited to those embodiments.

DETAILED DESCRIPTION OF THE PREFERRED EMBODIMENTS

Embodiments of the invention will be described hereinbelow by reference to the drawings while a light-emitting device is taken as an example.

Figure 1:
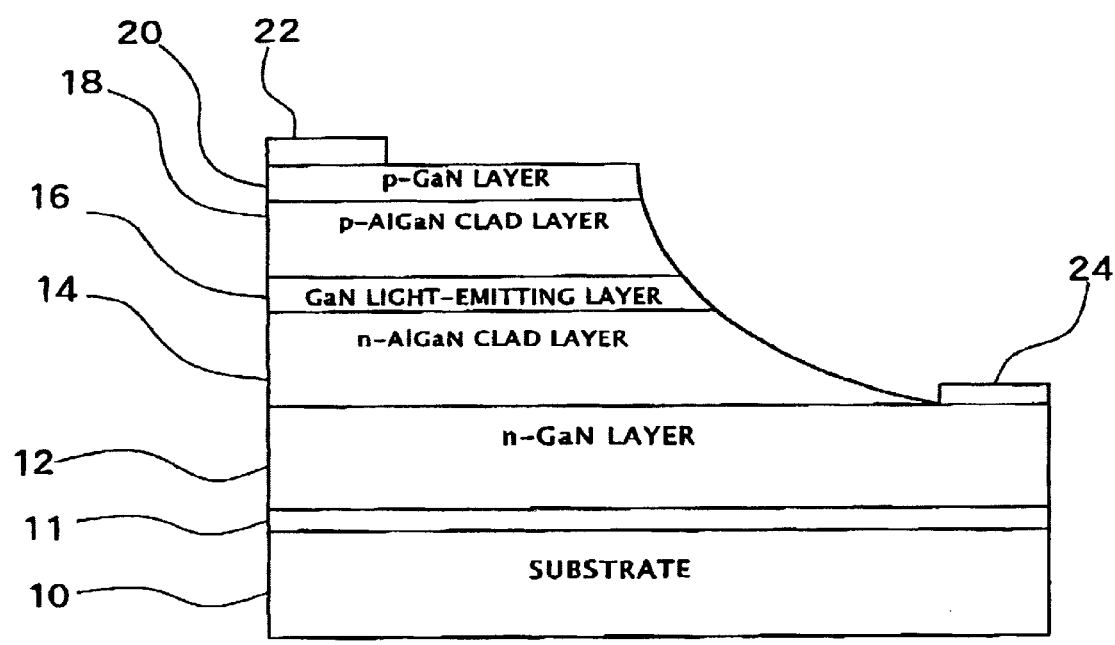
FIG. 1 is a view showing the structure of a light-emitting device according to an embodiment of the invention.

FIG. 1 shows the overall structure of a GaN-based light-emitting device according to an embodiment of the invention. A buffer layer 11 is formed on a substrate 10 such as sapphire, and an n-type GaN layer 12 is grown on the buffer layer 11 An n-type AlGaN clad layer 14, a GaN light-emitting layer 16, and a p-type AlGaN clad layer 18 are grown on the n-type GaN layer 12. Further, a p-type GaN electrode formation layer 20 is formed on the p-type AlGaN clad layer 18. After the surface of the substrate has been etched such that a portion of the n-type GaN layer 12 becomes exposed, a p-type ohmic electrode 22 and an n-type ohmic electrode 24 are formed. An AlGaN light-emitting layer, an AlGaInN light-emitting layer, or an AlInN light-emitting layer can also be used in lieu of the GaN light-emitting layer 16. The clad layers 14, 18 are provided for the purpose of implanting carriers into the GaN light-emitting layer 16. An SLS (strained layer superlattice) clad layer formed by alternately stacking AlGaN and GaN can also be used in place of the AlGaN clad layer.

A conventional apparatus has hitherto formed the buffer layer 11 to a thickness of 20 to 30 nm at a temperature as low as about 500° C. through use of GaN, AlGaN, or AlN. In the embodiment, $Al_xGa_{1-x}N_{1-y}P_y$ or $Al_xGa_{1-x}N_{1-y}As_y$ (where $0 \leq x \leq 1$, $0 < y < 1$) is employed as the buffer layer 11. For instance, $GaN_{1-y}P_y$ obtained by substituting 0 into "x" (x=0) is used. Specifically, a buffer layer, in which N in GaN, AlGaN, or AlN is partially substituted by P or As, is used.

A low-temperature growth GaN is a polycrystalline layer including a vast amount of imperfections. A natural GaN crystal is known to assume a hexagonal crystal form, whereas the low-temperature growth layer is known to include numerous cubic crystal components. A natural GaP crystal system is a cubic system. In a case where GaP is used as a buffer layer, numerous cubic components remain even when a growth temperature has been increased, and consequently a dislocation density of the GaN layer 12 formed on the buffer layer 11 can be diminished. In a case where GaN is used as the buffer layer 11, a hexagonal component of a natural crystal system becomes larger with an increase in temperature even when a cubic component is obtained by growing the crystal at low temperatures, because the natural crystal system is a hexagonal system. Consequently, dislocation of the GaN layer 12 to be formed on the buffer layer 11 can be inhibited. A conceivable reason for this is that a cubic component including numerous imperfections lessens lattice matching developing between GaN and sapphire, thereby reducing the dislocation density of GaN. The same also applies to a case where GaAs is used in lieu of GaP. The dislocation density of the GaN layer can be reduced even at a high temperature by means of numerous cubic components. The same also applies to a case where AlGaN is used instead of GaN as a material for the buffer layer 11. The dislocation density of the GaN layer 12 can be reduced by forming the buffer layer 11 from AlGaNP or AlGaNAs.

Use of $Al_xGa_{1-x}N_{1-y}P_y$ or $Al_xGa_{1-x}N_{1-y}As_y$ enables formation of the buffer layer 11 at a high temperature. As a result, the temperature of the substrate can be set to a desired temperature within a short period of time when the temperature of the substrate is lowered to a second temperature for forming the buffer layer 11 after the substrate has been subjected to heat treatment at a first temperature. Since a starting temperature is high, the temperature of the substrate can be set to a desired temperature (1050° C.) within a short period of time even when the GaN layer 12 is formed by increasing the temperature from the second temperature to a third temperature after formation of the buffer layer 11. If the buffer layer 11 can be formed at a temperature in the vicinity of 1000° C., a process for heating the substrate 10, a process for growing the buffer layer 11, and a process for growing the GaN layer 12 can be performed at substantially identical temperatures. The thickness of the buffer layer 11 is about 10 nm to 100 nm, preferably about 10 nm to 50 nm.

Figure 2:
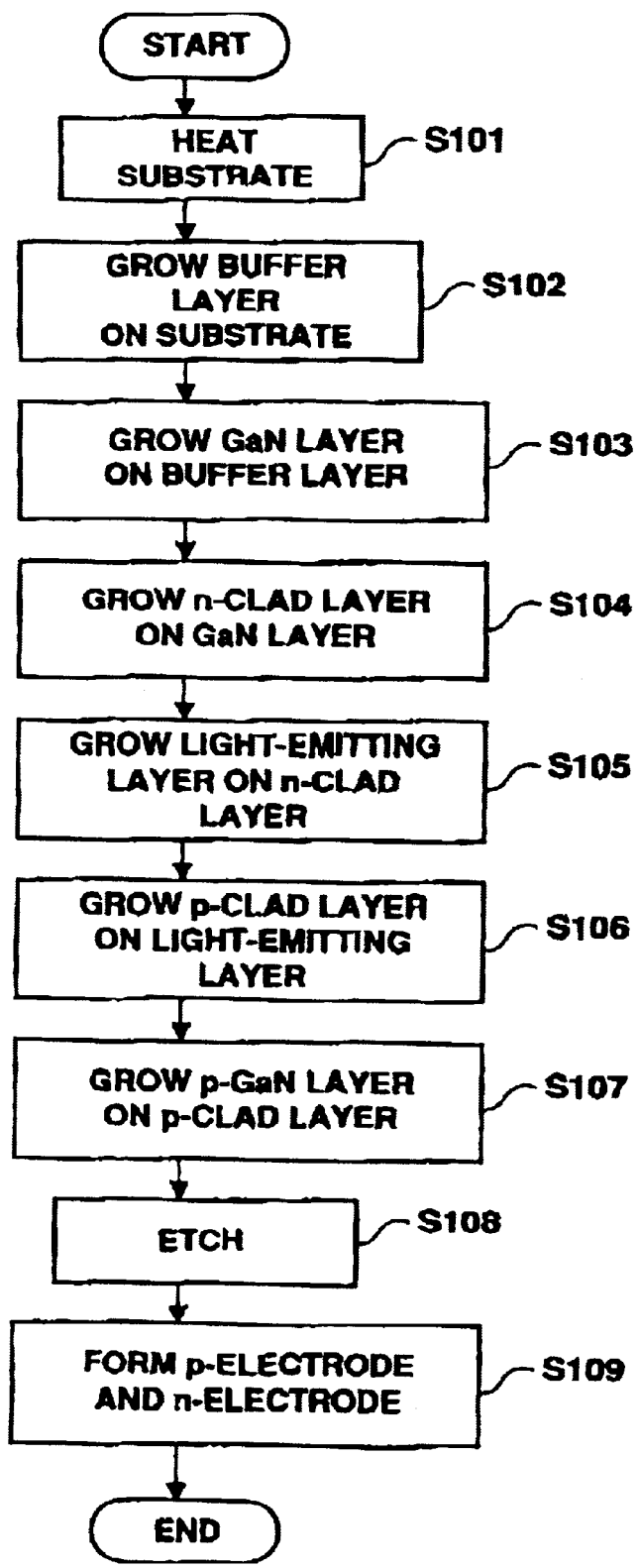
FIG. 2 is a flowchart for manufacture of the light-emitting device shown in FIG. 1.

FIG. 2 is a flowchart showing manufacture of the light-emitting device shown in FIG. 1. The substrate 10 is loaded in the MOCVD apparatus and heated at a first temperature (e.g., 1100° C.) (S101) Subsequently, the substrate 10 is cooled to a second temperature (e.g., 700° C.). The buffer layer 11 formed from any of GaNP, AlGaNP, AlNP, GaNAs, AlGaNAs, and AlNAs is grown on the substrate 10 at the second temperature (S102). The temperature at which the buffer layer 11 is to be grown is higher than a temperature at which a buffer layer of a conventional light-emitting device is to be grown (e.g., 500° C.). After the buffer layer 11 has been grown, the temperature is increased to a third temperature (e.g., 1050° C.), thereby growing the n-GaN layer 12 on the buffer layer 11 (S103). After the n-GaN layer 12 is grown, the n-clad layer 14, the light-emitting layer 16, the p-clad layer 18, and the p-GaN layer 20 are sequentially grown on the n-GaN layer 12 (S104 to S107). The substrate 10 is then removed from the MOCVD apparatus, and the surface of the substrate 10 is etched until the GaN layer 12 becomes exposed (S108). The p-GaN layer 20 and the p-ohmic electrode 22 are formed, and the n-ohmic electrode 24 is formed on the n-GaN layer 12 (S109).

The method for manufacturing the light-emitting device of the embodiment will be described hereinbelow in more detail.

A c-surface sapphire substrate is placed on a susceptor provided in a pipe of the MOCVD apparatus, and a mixed gas consisting of hydrogen and nitrogen is introduced into the pipe from a gas inlet pipe while the substrate is being heated up to a temperature of 1100° C. through use of a heater, thereby heating the substrate for ten minutes. Next, a $GaN_{1-y}P_y$ buffer layer is formed on the substrate at temperature T1 (° C.). A growth time is controlled such that the buffer layer assumes a thickness of about 20 nm. Trimethylgallium $Ga(CH_3)_3$, ammonia gas ($NH_3$) gas, and phosphine ($PH_3$) including P are introduced as material gases from the gas inlet pipe. Further, in order to make the flow rate of the gases stable, a hydrogen gas and a nitrogen gas are caused to flow into a reaction pipe. Here, a flow rate of trimethylgallium is 10 $\mu$mol/min., a flow rate of ammonia gas is 5 SLM (standard liters per minute), a flow rate of hydrogen gas is 10 SLM, and a flow rate of nitrogen gas is 10 SLM. A flow rate of phosphine gas is varied within a range from 0 to 1 SLM. A correlation exists between the flow rate of phosphine and "y" representing a composition ratio of P. The composition ratio "y" can be increased by increasing the flow rate of phosphine gas. The temperature of the substrate is then increased to T2=1050° C., thereby growing a GaN layer to a thickness of 2 μm. The GaN layer is essentially identical with the buffer layer in terms of growth conditions, except that the flow rate of phosphine gas is 0. Trimethylgallium gas and ammonia gas are introduced into the gas inlet pipe as raw material gases. After the GaN layer has been grown at a high temperature, the surface condition of the GaN layer is observed under a microscope. In relation to some samples, the GaN layer is subjected to depthwise elementary analysis through use of a secondary ion mass spectrometer (SIMS). An approximate value of the composition ratio "y" of P in the buffer layer is estimated. The absolute value of "y" must be measured through comparison between a sample to be measured and a standard sample having a composition analogous to that of the sample to be measured. GaP and GaN are used as standard samples in the embodiment. The absolute value of GaP and that of GaN include slight errors. Table 1 shows results of evaluation of GaN.

TABLE 1

TEST RESULTS (x = 0)

| y | T1 (° C.) | Surface Conditioner High-Temperature Growth GaN |
|---|---|---|
| 0 | 500 | ⊚ |
| 0 | 600 | ○ |
| 0 | 700 | X |
| 0.0003 | 500 | ⊚ |
| 0.0003 | 600 | ⊚ |
| 0.0003 | 700 | X |
| 0.005 | 600 | ⊚ |
| 0.005 | 700 | ⊚ |
| 0.005 | 800 | ○ |
| 0.01 | 800 | ○ |
| 0.01 | 900 | ○ |
| 0.01 | 1050 | X |

⊚ Mirror Surface,
○ Essentially Mirror Surface,
X Whitish Surface

The buffer surface is GaNP, wherein x=0. The growth temperature T1 for the buffer layer is varied within a range from 500° C. to 1050° C. As can be seen from Table 1, when y=0, the surface of the GaN layer becomes whitish and considerably deteriorated as a result of an increase in the growth temperature T1 to 700° C. (T1=700° C.). When the composition ratio "y" is increased to a value of 0.005 (y=0.005), a mirror surface is formed on the surface of the GaN layer in spite of the growth temperature T1 being increased to 700° C. (T1=700° C.). Thus, it is understood that, even when the growth temperature T1 is increased to about 700° C., the surface of the GaN layer is not deteriorated as a result of the buffer layer being doped with P. Further, when the composition ratio "y" is increased to 0.01 (y=0.01), an essentially mirror-like surface is formed on the surface of the GaN layer in spite of the growth temperature T1 being increased to 900° C. (T1=900° C.). When the growth temperature is increased to 1050° C. (T1=1050° C.), the surface becomes whitish. A conceivable reason for the surface of GaN layer becoming deteriorated when the growth temperature T1 for the buffer layer is too high is that the buffer layer does not become a continuous film. Specifically, a conceivable reason is that, when a growth temperature is high, a growth seed becomes solid at a point of stability after having migrated through the surface of the sapphire substrate, thus constituting an island-shaped crystal. When the island has become large and the density of the island has become small, the surface of the island does not become flat unless the crystal GaN layer to be grown on the crystal becomes extremely thick.

Results of tests which were conducted while $AlN_{1-y}P_y$ was used as a buffer layer; that is, when x=0, are as follows. The growth conditions for the buffer layer are essentially identical with those mentioned previously, except that 20 μmol/min trimethylaluminum is caused to flow into the reaction pipe in place of trimethylgallium. Phosphine gas including P is also used as a raw material gas. The surface condition of the GaN layer was observed while the growth temperature T1 for the buffer layer was varied within the range of 800° C. to 1050° C. Results of observation are provided in Table 2.

TABLE 2

TEST RESULTS (x = 1)

| y | T1 (° C.) | Surface Condition of High-temperature Growth GaN |
|---|---|---|
| 0.01 | 800 | ⊚ |
| 0.01 | 900 | ⊚ |
| 0.01 | 1050 | ⊚ |

As can be seen from Table 2, when AlNP is used as a buffer layer, a mirror surface is obtained even at a temperature as high as 1050° C. (which is identical with the growth temperature T2 for the high-temperature growth GaN layer) A conceivable reason for these results is that the seed does not migrate over as a long distance as that required in the case of GaNP, because of strong bonding existing between Al and sapphire, and a dense crystal nucleus is formed. The growth temperature for the buffer layer and the growth temperature for the GaN layer to be grown on the buffer layer can be set to the same temperature (i.e., T1=T2), whereby a crystal growth process is simplified and a time required for one growing operation is shortened, thereby improving productivity.

As mentioned above, using GaNP or AlNP as a buffer layer enables simplification of the crystal growth process. The present inventor has grown a crystal GaN layer through use of an AlNP buffer layer grown at a temperature of 1050° C. and has prototyped, on the crystal GaN layer, an LED which illuminates over the range from ultra-violet to a blue color. The thus-prototyped LED was ascertained to be identical in luminous characteristic with a conventional LED. In contrast to a conventional growth process requiring four hours, the growth process of the embodiment requires two-and-a-half hours, thus significantly shortening the growth process.

In order to grow a buffer layer from GaNAs, AlGaNAs, or AlNAs, a raw material gas containing As in lieu of phosphine; e.g., arsine or tertial butyl arsine, is supplied to the reaction pipe.

In addition to phosphine, an organic material, such as tertial butyl phosphine, can also be used as a raw material gas for P.

The cases where x=0 and x=1 have been described. However, a person skilled in the art can readily understand that a buffer layer can be grown at a high temperature even when "x" assumes other values; that is, when AlGaNP or AlGaNAs is used as a material for a buffer layer.

Moreover, although the case of the LED using GaN has been described, the invention can also be similarly applied to a laser or a light-receiving device using GaN.

Figure 3:
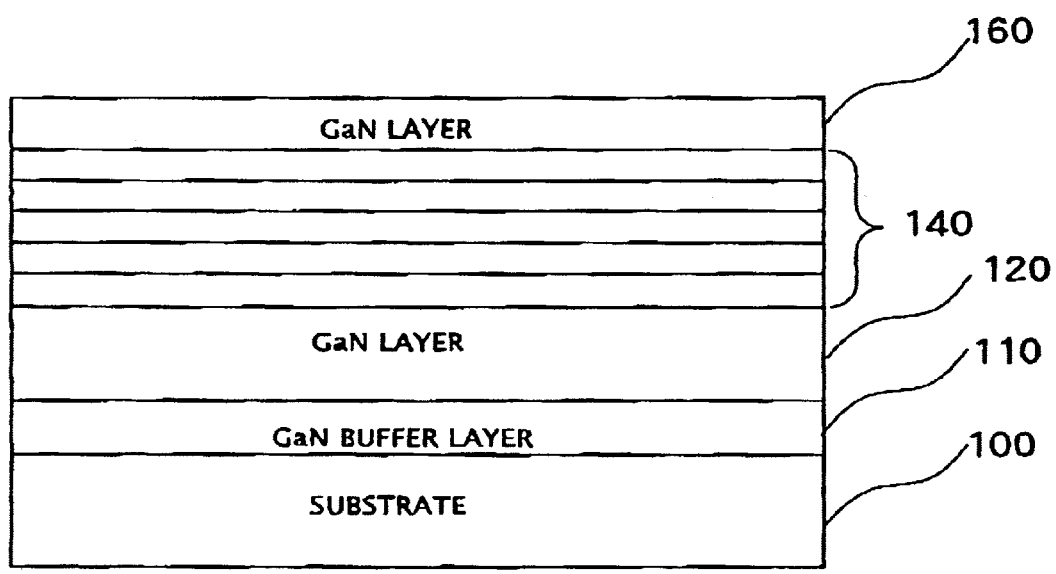
FIG. 3 is a view showing the structure of a GaN-based compound semiconductor device according to another embodiment of the invention.

FIG. 3 shows another configuration of the GaN-based compound semiconductor device. A GaN buffer layer 110 is formed on a substrate 100, such as sapphire, at a temperature as low as 500° C. After the GaN buffer layer 110 is formed, the temperature is increased to about 1050° C., to thereby form a GaN layer 120. Further, a multiple quantum layer (MQW) 140 formed by alternately stacking a GaNP layer and a GaN layer is formed on the GaN layer 120. A GaN layer 160 is formed on the MQW layer 140. Prior to formation of the GaN buffer layer 110, an SiN buffer having a thickness of several nanometers may be formed discretely or into the shape of an island. In this way, the (GaNP/GaN) MQW layer 140 is inserted between the GaN layers, thereby greatly reducing the dislocation density of the GaN layers.

The dislocation density of the GaN layers is reduced by insertion, between the GaN layers, of the multiple quantum well (MQW) layer formed by alternately stacking GaNP and GaN. The reason for this is that P atoms of the GaNP layer are selectively taken into the locations of dislocations as a result of growth of the MQW layer 140 of GaNP/GaN on the GaN layer 120, thereby terminating the dislocations of the GaN layer 120. GaNP employed in the embodiment is formed by partially substituting N of GaN with P. A GaNP crystal formed by doping GaP with a small amount of N is unstable, in light of thermodynamics, and readily separated into GaN and GaP through phase separation, thereby causing dislocations. For this reason, the composition ratio P (a mean value obtained at the surface not at a point of dislocation) and the thickness of GaNP in the MQW layer 140 of GaNP/GaN are preferably set within appropriate ranges. Specifically, the P composition ratio and thickness of GaNP are set in accordance with the degree of surface roughness and the dislocation density of the GaN layer 120. In the case where a dislocation density assumes a value of about $10^9$ $cm^{-2}$, the composition ratio P assumes a value of about 1% or less. If the composition ratio P becomes smaller, the effect of a reduction in dislocation density is reduced. The composition ratio P ranges from 0.01% to 0.5%, more preferably, 0.05% to 0.2%. The thickness of GANP can be set in accordance with the composition ratio P. When the composition ratio P assumes a value of 0.1%, the thickness assumes a value of 5 nm or less (or a volume corresponding to a thickness of 5 nm or less), more preferably 3 nm or less (or a volume corresponding to a thickness of 3 nm or less). The effect of a reduction in dislocation density is reduced by setting the thickness of GaNP to 1 nm or less. Therefore, an applicable thickness ranges from 1 nm to 5 nm, more preferably 1 nm through 3 nm.

In connection with the MQW layer 140 of GaNP/GaN, an optimal periodicity of the MQW (i.e., the number of repetitions of GaNP/GaN) is set in accordance with the composition ratio P and the thickness of GaNP. If the periodicity assumes a value of 100 or less, the effect of a reduction in dislocation density is produced. If the periodicity assumes a value of 20 or more, the effect will become saturated. If the periodicity exceeds a value of 100, roughness appears on the surface of the MQW layer 140. An optimal periodicity ranges from 1 to 100, more preferably 1 to 20.

Figure 4:
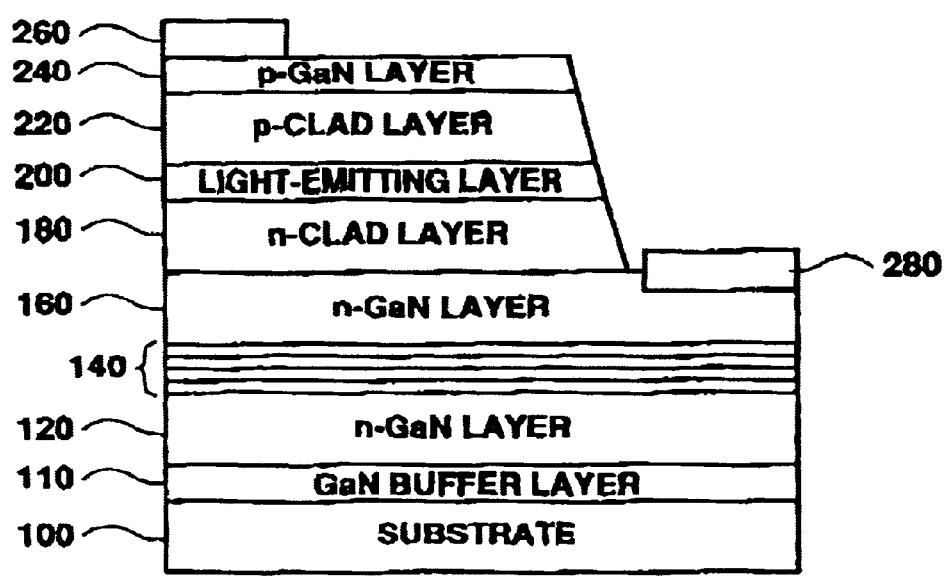
FIG. 4 is a view showing the structure of a light-emitting device of another embodiment of the invention.

FIG. 4 shows the construction of a light-emitting device having the structure shown in FIG. 3. The GaN buffer layer 110 is formed on the substrate 100 such as sapphire, and the n-GaN layer 120 is formed on the GaN buffer layer 110 subsequently, the MQW layer 140 of GaNP/GaN is formed on the n-GaN layer 120. The n-GaN layer 160 is formed on the MQW layer 140 of GaNP/GaN. The construction of the light-emitting device ranging from the substrate 100 through the n-GaN layer 160 is identical with that shown in FIG. 3. An n-clad layer 180, a light-emitting layer 200, and a p-clad layer 220 are sequentially formed on the n-GaN layer 160. The n-clad layer 180 is formed from, e.g., n-AlGaN, and the p-clad layer 220 is formed from, e.g., p-AlGaN. In order to impart a negative conductivity type to AlGaN, AlGaN is doped with Si or the like. In order to impart a positive conductivity type to AlGaN, AlGaN is doped with Mg or the like. A p-GaN electrode formation layer 240 is formed on the p-GaN clad layer 220, and the surface of the p-GaN electrode formation layer 240 is etched until the n-GaN layer 120 becomes exposed. After etching, a p-ohmic electrode 260 is formed on the p-GaN layer 240, and an n-ohmic electrode 280 is formed on the n-GaN layer 120. The dislocation density of the n-GaN layer 160 is reduced by the MQW layer 140 of GaNP/GaN, thereby improving the luminous efficiency of the light-emitting layer 200.

A specific method for manufacturing the GaN-based semiconductor device shown in FIG. 4 is as follows. Through use of the MOCVD apparatus, the sapphire c-surface substrate 100 is subjected to heat treatment at a temperature of 1100° C. for about 10 minutes in a hydrogen atmosphere. The temperature is then lowered to 500° C. The GaN buffer layer 110 having a thickness of 20 nm is grown by feeding trimethylgallium and an ammonia gas. Subsequently, the temperature is increased to 1050° C., and the trimethylgallium and the ammonia gas are again supplied, to thereby form the GaN layer 120 to a thickness of 2 $\mu$m. Next, the MQW 140 (of GaNP having a thickness of 2.2 nm/GaN having a thickness of 25 nm) is grown at the sane temperature to a periodicity of five. The GaN layer 160 is grown at the same temperature to a thickness of 0.8 $\mu$m. Here, a GaN crystal is grown under the following conditions; namely, the flow rate of trimethylgallium is 15 $\mu$mol/min., the flow rate of ammonia is 15 SLM, and the flow rate of hydrogen carrier gas is 17 SLM. Conditions for growing GaNP are embodied by adding 200 sccm of 0.1% hydrogen-diluted carrier phosphine ($PH_3$) to the growth conditions for GaN. A growth time for a GaNP layer in the MQW layer 140 is five seconds, and a growth time for a GaN layer in the same is 60 seconds.

Figure 5:
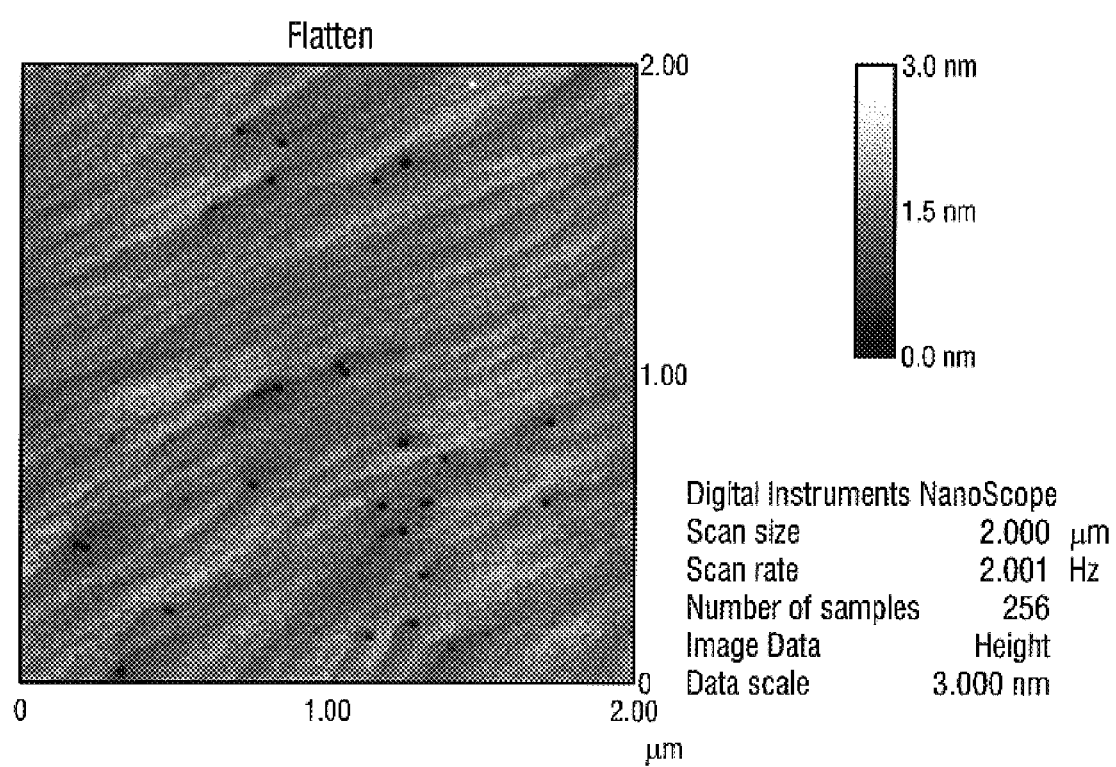
FIG. 5 is an atomic force microscope (AFM) photograph of a GaN crystal when the crystal has been grown on a substrate.
Figure 6:
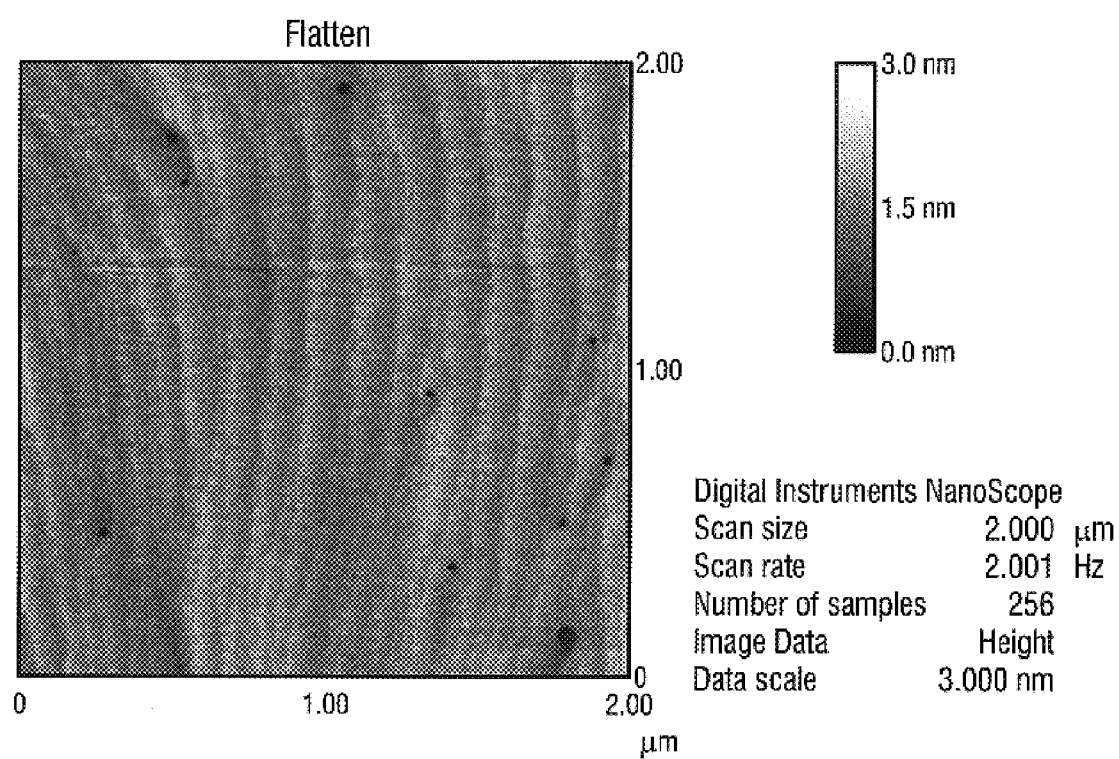
FIG. 6 is an AFM photograph of the GaN crystal when a (GaNP/GaN) MQW (multiple quantum well) layer has been inserted into the crystal.

Measurement of the composition of P in the GaNP grown under such conditions, within a range of 100×100 $\mu m^2$ through use of the SIMS, shows that P assumes a value of 0.1%. For comparison, there was also prepared a sample in which only a GaN layer is grown without growth of the (GaNP/GaN) MQW 140 under the same conditions. Observation of surfaces of the grown GaN layers through use of an AFM (Atomic Force Microscope) show that the dislocation density of the sample—in which the GaN crystal is grown with the (GaNP/GaN) MQW layer 140 being sandwiched therein—is obviously reduced. FIG. 5 is an AFM photograph showing the sapphire substrate 100 on which only the GaN crystal is grown. FIG. 6 is an AFM photograph showing the (GaNP/GaN) MQW layer 140 inserted into the grown GaN crystal. Provision of the MQW layer 140 reduces the dislocation density to about one-quarter the original dislocation density. The influence of a solid-phase composition ratio "y" of and the thickness of the $GaN_{1-y}P_y$ on dislocation are examined by changing the growth conditions for the $GaN_{1-y}P_y$ ($0<y\leq$) in the MQW layer 140. The results show that, in a case where the composition ratio P is large or where the GaNP has a large thickness, the dislocation density is increased. An optimal solid phase ratio is determined on the basis of a film thickness. For instance, when the composition ratio P is set to a value of 0.1% and only the thickness of the GaNP layer is changed, the surface of the GaNP layer is observed to become gradually roughened when the growth time for the GaNP layer has exceeded 10 seconds. Further, the surface is observed to gradually become roughened even when the flow rate of phosphine is doubled.

Figure 7A:
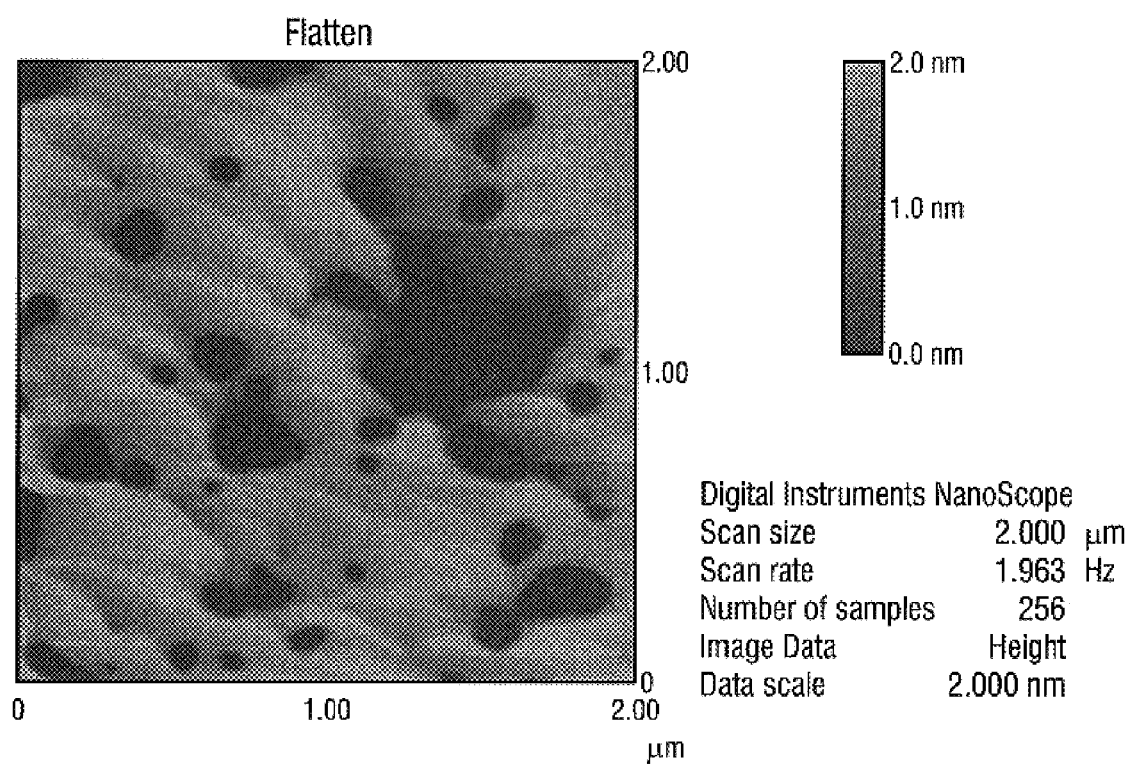
FIG. 7A is another AFM photograph of the GaN crystal when the crystal has been grown on the substrate.
Figure 7B:
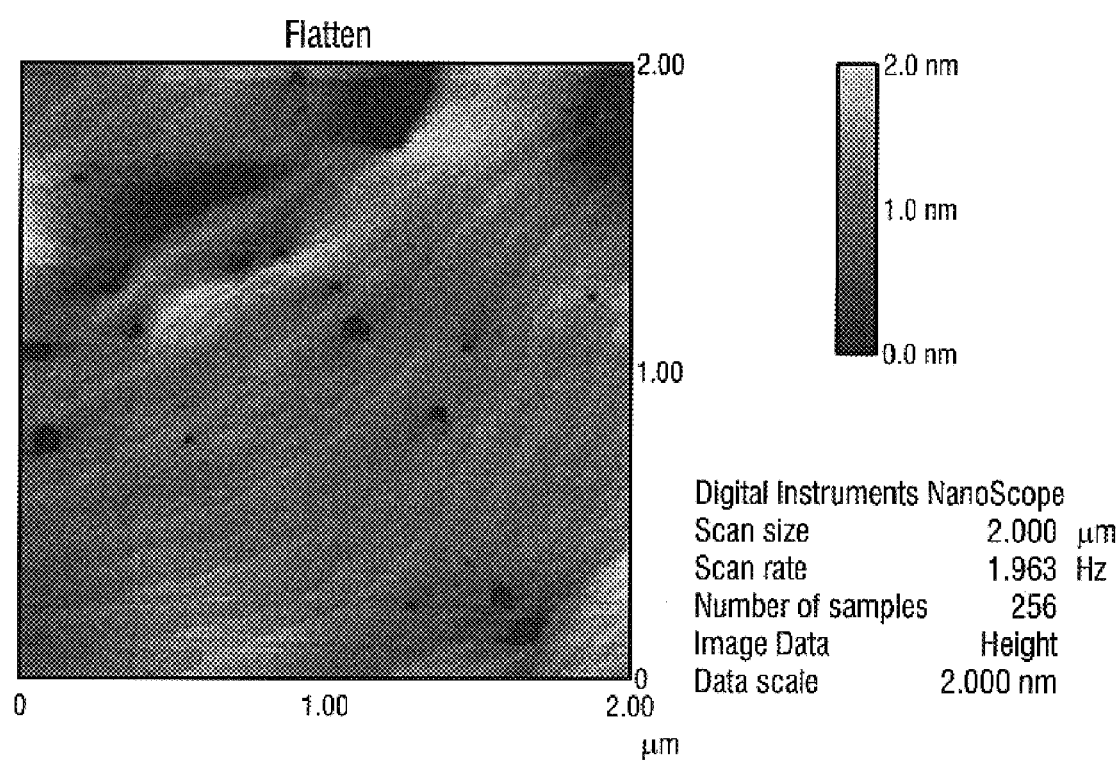
FIG. 7B is an AFM photograph of the GaN crystal when GaNP has been grown on the crystal for five seconds.
Figure 7C:
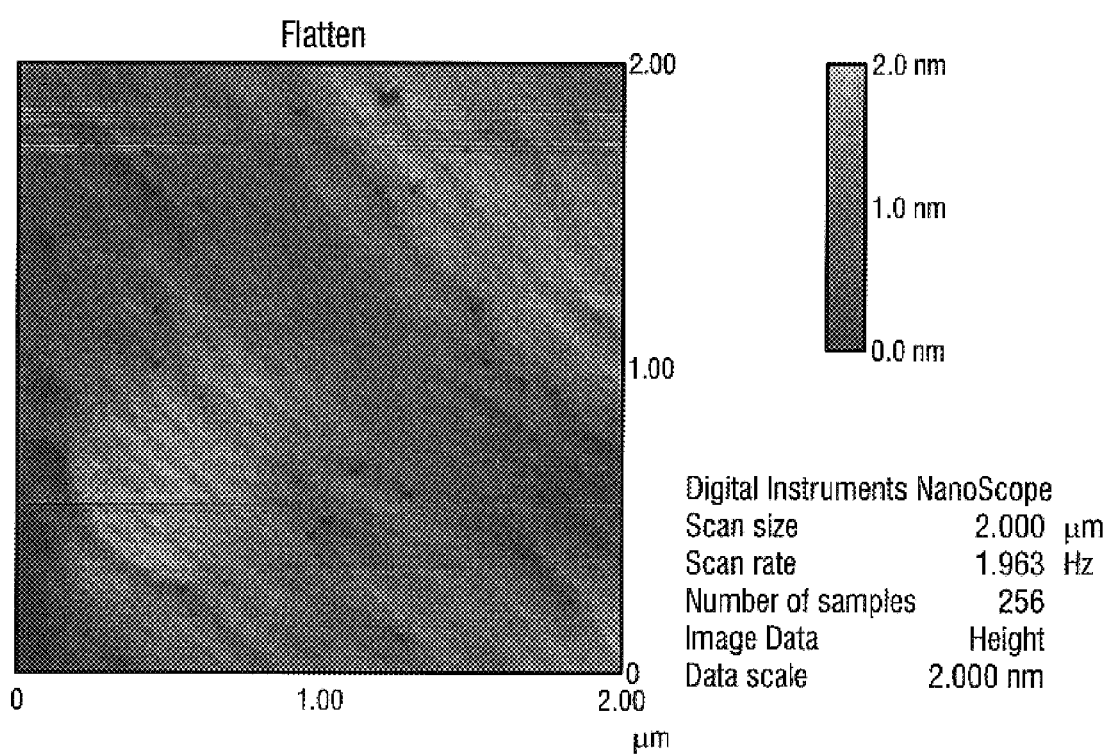
FIG. 7C is an AFM photograph of the GaN crystal when GaNP has been grown on the crystal for 15 seconds.

Further, in order to clarify the reason why the dislocation density is reduced by insertion of the (GaNP/GaN) MQW layer 140 into the GaN crystal, GaNP is grown on the GaN layer 120, and the growth of GANP is suspended in its present form. The surface of the GaNP is observed. FIGS. 7A, 7B, and 7C show the results of observation. In this case, in order to clarify the effect of the GaNP layer, the growth conditions for the GaN buffer layer 110 are intentionally controlled such that the surface of GaN becomes comparatively roughened. When GaNP is grown on the GaN layer 120 whose surface has been comparatively damaged, the surface becomes gradually smooth. Further, spots corresponding to imperfections are also reduced. When the growth time of GaNP assumes five seconds, the thickness of the grown layer assumes a thickness of about 2.2 nm. When the grown time of GaNP assumes 15 seconds, the thickness of the grown layer assumes about 6.6 nm. FIG. 7A shows the surface of the GaN crystal surface; FIG. 7B shows GANP which has been grown for five seconds. Further, FIG. 7C shows GaNP which has been grown for only 15 seconds. It is understood that the crystal surfaces shown in FIGS. 7B and 7C contain a smaller amount of imperfections than those shown in FIG. 7A.

Figure 8A:
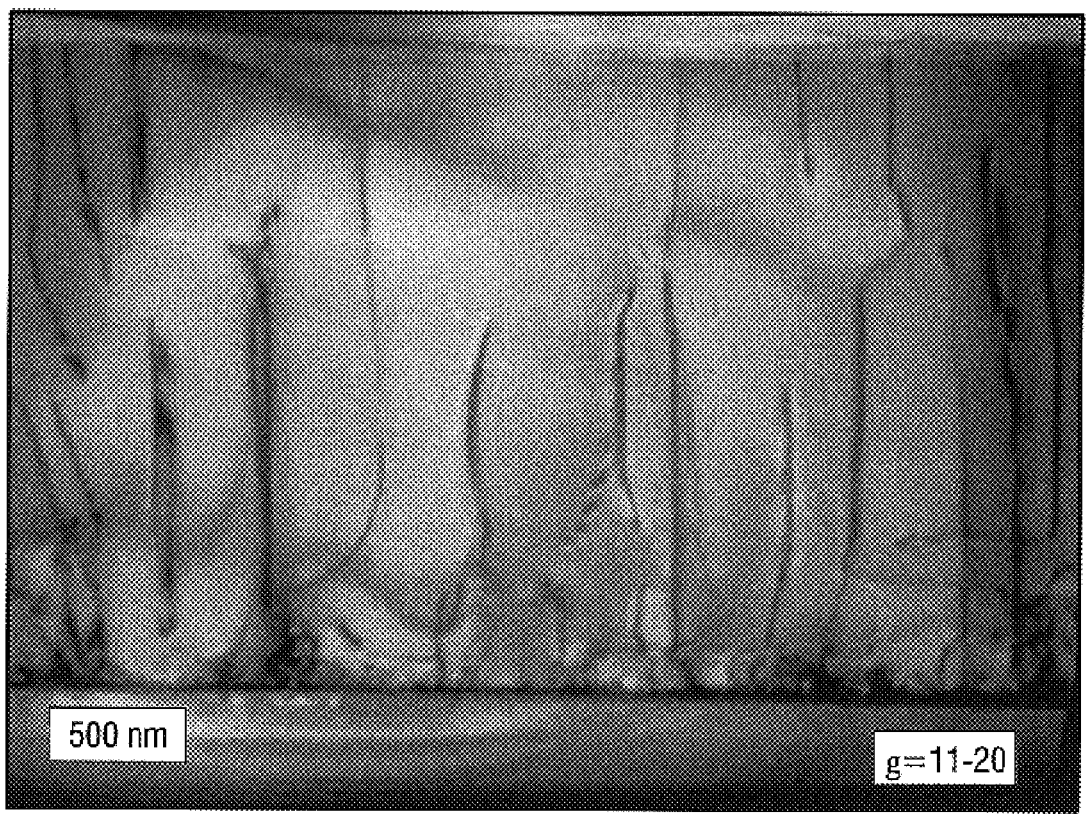
FIG. 8A is a cross-sectional electron microscope (EM) photograph of g=11–20.
Figure 8B:
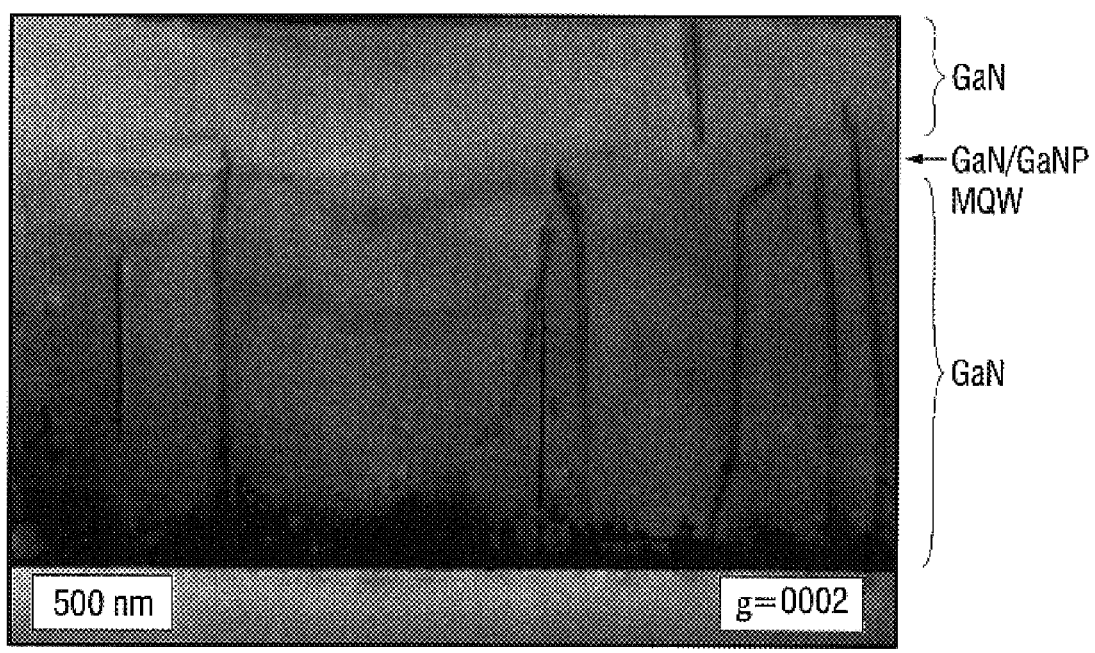
FIG. 8B is a cross-sectional EM photograph of g=0002.

If the surface roughness of GaN is as high as 50 mm and a film having a thickness of about 2.2 nm is uniformly formed, the previously-described improvement of the surface condition cannot be explained. Therefore, it is assumed that P atoms are selectively taken into holes (spots) formed in the surface, and the volume of holes and the volume of the GaNP layer are compared with each other. The result of comparison shows a very high correlation. The correlation suggests that GaNP is selectively taken into imperfections, such as holes or spots formed in the surface. Dislocations originally disappear only as a result of formation of a free surface or a dislocation loop. The reason why the dislocation density is reduced by GaNP is that P atoms are selectively taken into the positions of dislocations and the P atoms constitute a dislocation loop; that is, the P atoms act as terminators for dislocations. FIGS. 8A and 8B are cross-sectional scanning electron microscope photographs pertaining to the structure shown in FIG. 3. These images are observed at the same locations. FIG. 8A is an image of g-vector 11-2-, and FIG. 8B is an image of g-vector 0002. According to inhibition rules of electron diffraction, FIG. 8A shows only an observation of a pure edge dislocation and a mixed dislocation, and FIG. 8B shows only an observation of a pure spiral dislocation and a mixed dislocation. Comparison of the observations reveals extinction of the pure spiral dislocation at the position of the MQW layer 140. The spot observed by means of the AFM shows spiral dislocations. Hence, the result is appropriate. P atoms are ascertained to be selectively taken into spiral dislocations existing in the surface of GaN, thereby terminating the dislocations at those locations. From the atomic viewpoint, the areas where the dislocations exist have greater numbers of dangling bonds than do flat areas. Atoms which have reached the dangling bonds are strongly trapped. For this reason, atoms having a high vapor pressure by virtue of a growth temperature of 1050° C. of GaN, such as P atoms, are appropriately considered to be selectively trapped into the spiral dislocations.

Specifically, a UV LED having a wavelength of 350 nm band is fabricated in the following sequence by utilization of a reduction in dislocation density responsible for the MQW layer 140 of GaNP/GaN.

The sapphire c-surface substrate 100; a discrete SiN buffer; the undoped GaN layer 110 having a thickness of 0.4 $\mu$m; an Si-doped GaN layer 120 having a thickness of 1.5 $\mu$m; a (GaN/GaNP) MQW layer 140 having a periodicity of five; the Si-doped GaN layer 160 having a thickness of 0.5 $\mu$m; the (Si-doped $Al_{0.1}Ga_{0.9}N$ of 2 nm/GaN of 2 nm) MQW clad layer 180 having a periodicity of 100; the GaNSQW light-emitting layer 200 having a thickness of 2 nm; the (Mg-doped $Al_{0.1}Ga_{0.9}N$ of 2 nm/GaN of 1 nm) MQW clad layer 220 having a periodicity of 50; and the Mg-doped GaN layer 240 having a thickness of 10 nm.

After growth, a portion of the surface of the substrate is etched, to thereby expose the n-type GaN layer 120 on the surface. An LED was fabricated by forming the transparent p-electrode 260 and the n-electrode 280. Simultaneously, an LED-which has the same structure and from which only the (GaN/GaNP) MQW layer 140 having a periodicity of five is removed-was also fabricated. Both LEDs have a luminous peak wavelength or 355 nm. The luminous intensity of the LED in which the (GaN/GaNP) MQW layer 140 having a periodicity of five is inserted is about triple that of the other LED. This result shows that the (GaN/GaNP) MQW layer 140 improves the crystallinity of GaN and that of the layer formed on GaN, thus improving a device characteristic.

In the embodiment, an AlGaN layer can also be used as the GaN-based layer. Specifically, the dislocation density of the AlGaN layer can also be reduced by inserting the GaNF/GaN MQW layer 140 into the AlGaN layer.

Figure 9:
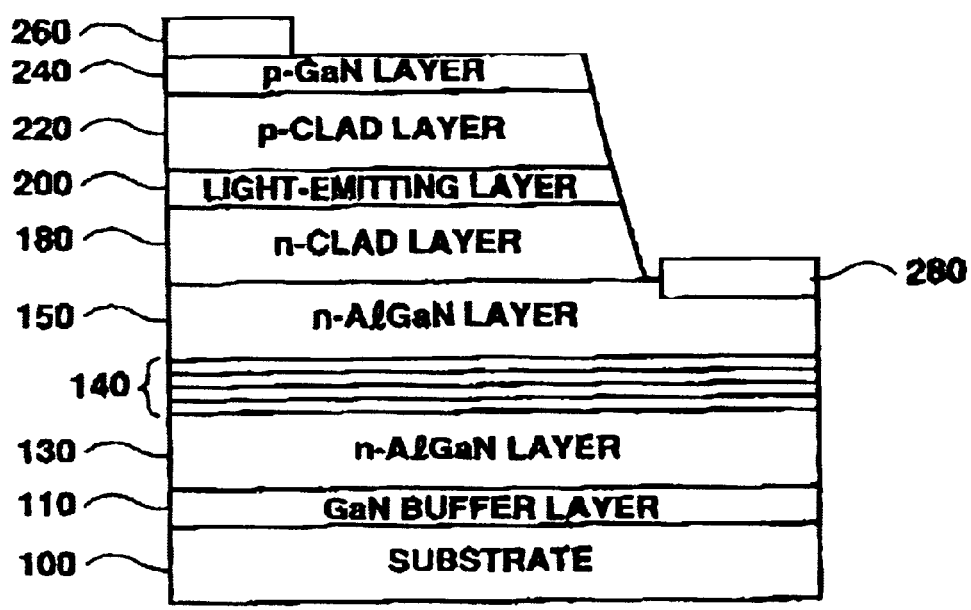
FIG. 9 is a view showing the structure of a light-emitting device according to another embodiment of the invention.

FIG. 9 shows the construction of a light-emitting device fabricated through use of an AlGaN layer. The light-emitting device differs from that shown in FIG. 4 in that an n-AlGaN layer 130 is formed on the GaN buffer layer 110; that a GaNP/GaN MQW layer 140 is formed on the n-AlGaN layer 130; and that an n-AlGaN layer 150 is formed on the GaNP/GaN MQW layer 140.

Figure 10A:
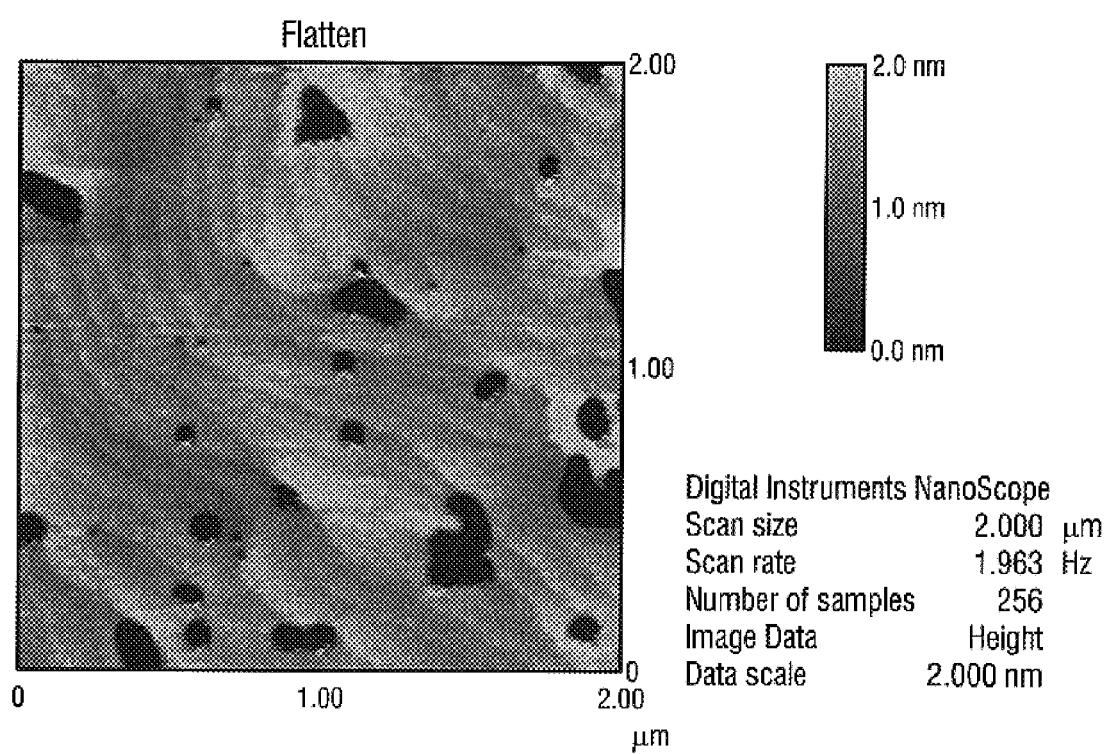
FIG. 10A is an AFM photograph of the device when an AlGaN layer has been grown on a GaN buffer layer.
Figure 10B:
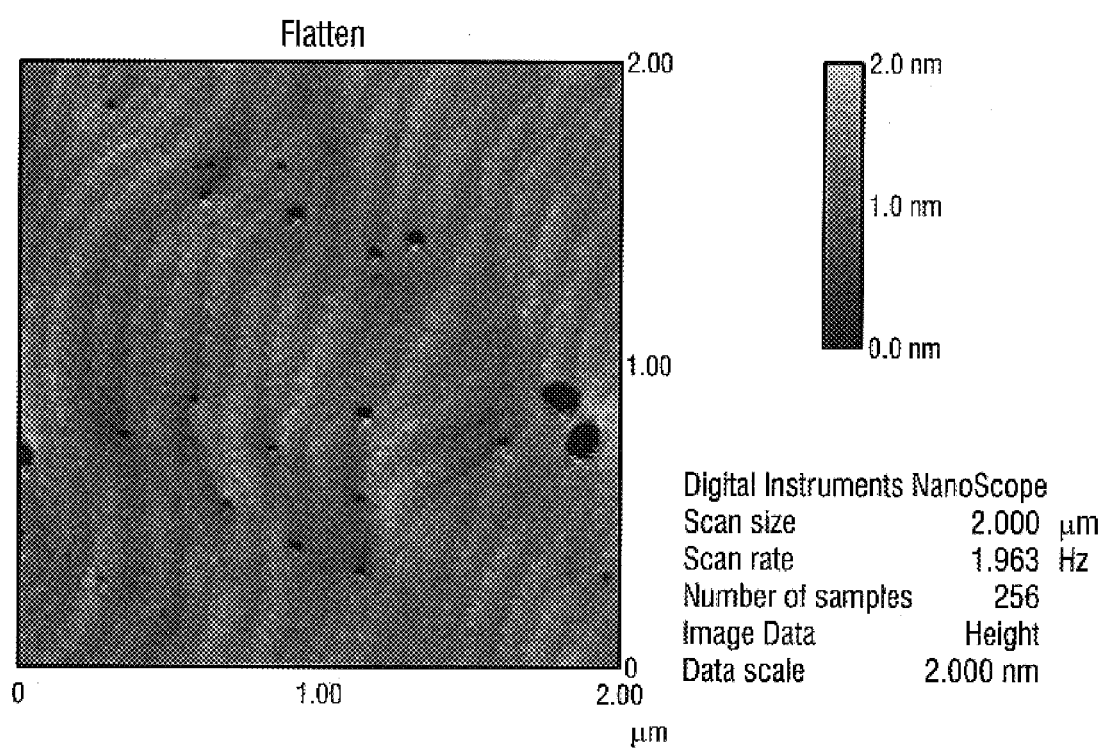
FIG. 10B is an AFM photograph of the device when the AlGaN layer and GaNP have been grown on the GaN buffer layer.

FIG. 10A is an AFM photograph of a surface in which the $Al_{0.1}Ga_{0.9}N$ layer is grown on the GaN buffer layer 110 to a thickness of 200 nm, and FIG. 10B is an AFM photograph of a surface in which GaNP is further grown on the $Al_{0.1}Ga_{0.9}N$ layer for five seconds (to a thickness of about 2.2 nm). Comparison between the drawings reveals a reduction in the number of spots corresponding to imperfections formed in the AlGaN layer, as in the case of the GaN layer.

An attempt has been made to achieve the same effect in connection with GaNAs. A substantially identical effect is obtained. However, an optimal thickness and an optimal composition obtained with GaNAs are determined to be slightly smaller than those obtained with GaNP.

In the embodiment, on the GaN buffer layer 110 there are sequentially formed the n-GaN layer 120 (or the n-AlGaN layer 130), the GaNP (or GaNAs)/GaN MQW layer 140, and the n-GaN layer 160 (or n-AlGaN layer 150). In place of the GaN buffer layer 110, the $Al_{1-x}Ga_xN_{1-y}P_y$ buffer layer 11 or the $Al_{1-x}Ga_xN_{1-y}As_y$ buffer layer 11 may be employed. An example of such a construction is provided below.

A substrate; a GaNP buffer layer/an n-GaN layer/a (GaNP+GaN) MQW layer; an n-GaN layer; an n-(AlGaN+

GaN) MQW clad layer; a GaN light-emitting layer; a p-(AlGaN+GaN) MQW clad layer; and a p-GaN layer.

Use of the GaNP buffer layer enables formation of a buffer layer at a high temperature (about 1000° C.) Further, heating of the substrate, growth of the buffer layer, and growth of the GaN layer can also be performed at substantially identical temperatures. Further, the dislocation density is reduced by inserting the (GaNP+GaN) MQW layer between the GaN layers, to thereby improve luminous efficiency.

What is claimed is:

1. A gallium-nitride-based compound semiconductor device, comprising:
   a substrate;
   a GaN-based buffer layer formed on said substrate; and
   a GaN-based compound semiconductor layer formed on said GaN-based buffer layer,
   wherein
   said GaN-based buffer layer comprises $Al_xGa_{1-x}N_{1-y}P_y$ ($0 \leq x \leq 1$, $0<y<0.01$).

2. The device according to claim 1, wherein said GaN-based buffer layer is formed at a temperature of 500° C. or more.

3. The device according to claim 1, wherein said GaN-based buffer layer and said GaN-based compound semiconductor layer are formed at a temperature of about 1000° C.

4. The device according to claim 1, wherein said GaN-based compound semiconductor device comprises:
   a GaN-based layer formed on said GaN-based buffer layer;
   a GaN-based clad layer of a first conductivity type formed on said GaN-based layer;
   a GaN-based light-emitting layer formed on said GaN-based clad layer of the first conductivity type; and
   a second GaN-based clad layer of a second conductivity type formed on said light-emitting layer.

5. The device according to claim 1, wherein said GaN-based buffer layer is formed by an MOCVD method using a raw material gas containing P.

6. A gallium-nitride-based compound semiconductor device, comprising:
   a substrate;
   a GaN-based buffer layer formed on said substrate; and
   a GaN-based compound semiconductor layer formed on said GaN-based buffer layer, wherein
   said GaN-based buffer layer comprises $Al_xGa_{1-x}N_{1-y}As_y$ ($0 \leq x \leq 1$, $0<y<0.01$).

7. The device according to claim 6, wherein said GaN-based buffer layer is formed at a temperature of 500° C. or more.

8. The device according to claim 6, wherein said GaN-based buffer layer and said GaN-based compound semiconductor layer are formed at a temperature of about 1000° C.

9. The device according to claim 6, wherein said GaN-based compound semiconductor device comprises:
   a GaN-based layer formed on said GaN-based buffer layer;
   a GaN-based clad layer of a first conductivity type formed on said GaN-based layer;
   a GaN-based light-emitting layer formed on said GaN-based clad layer of the first conductivity type; and
   a GaN-based clad layer of a second conductivity type formed on said light-emitting layer.

10. The device according to claim 6, wherein said GaN-based buffer layer is formed by an MOCVD method using a raw material gas containing As.

11. A gallium-nitride-based compound semiconductor device, comprising:
    a substrate;
    a GaN-based buffer layer formed on said substrate;
    a first GaN-based layer formed on said GaN-based buffer layer;
    a multiple quantum well (MQW) layer formed on said first GaN-based layer by alternately stacking plurality of $GaN_{1-y}P_y$ ($0.0001<y<0.005$) layers with a plurality of GaN layers; and
    a second GaN-based layer formed on said MQW layer.

12. The device according to claim 11, wherein said $GaN_{1-y}P_y$ satisfies $0.0005 \leq y \leq 0.002$.

13. A gallium-nitride-based compound semiconductor device comprising:
    a substrate;
    a GaN-based buffer layer formed on said substrate;
    a first GaN-based layer formed on said GaN-based buffer layer;
    a multiple quantum well (MQW) layer formed on said first GaN-based layer by alternately stacking a plurality of $GaN_{1-y}P_y$ ($0<y<1$) layers with a plurality of GaN layers;
    a second GaN-based layer formed on said MQW layer;
    a GaN-based clad layer of a first conductivity type formed on said second GaN-based layer;
    a GaN-based light-emitting layer formed on said GaN-based clad layer of the first conductivity type; and
    a second GaN-based clad layer of a second conductivity type formed on said light-emitting layer.

14. A gallium-nitride-based compound semiconductor device, comprising:
    a substrate;
    a GaN-based buffer layer formed on said substrate;
    a first GaN-based layer formed on said GaN-based buffer layer;
    a multiple quantum well (MQW) layer formed on said first GaN-based layer by alternately stacking a plurality of $GaN_{1-y}As_y$ ($0.0001<y<0.005$) layers with a plurality of GaN layers; and
    a second GaN-based layer formed on said MQW layer.

15. The device according to claim 14, wherein said $GaN_{1-y}As_y$ satisfies $0.0005 \leq y \leq 0.002$.

16. A gallium-nitride-based compound semiconductor device comprising:
    a substrate;
    a GaN-based buffer layer formed on said substrate;
    a first GaN-based layer formed on said GaN-based buffer layer;
    a multiple quantum well (MQW) layer formed on said first GaN-based layer by alternately stacking a plurality of $GaN_{1-y}As_y$ ($0<y<1$) layers with a plurality of GaN layers;
    a second GaN-based layer formed on said MQW layer;
    a GaN-based clad layer of a first conductivity type formed on said second GaN-based layer;
    a GaN-based light-emitting layer formed on said GaN-based clad layer of the first conductivity type; and
    a second GaN-based clad layer of a second conductivity type formed on said light-emitting layer.

* * * * *

UNITED STATES PATENT AND TRADEMARK OFFICE
CERTIFICATE OF CORRECTION

| | | |
|---|---|---|
| PATENT NO. | : 7,005,685 B2 | Page 1 of 1 |
| APPLICATION NO. | : 10/376551 | |
| DATED | : February 28, 2006 | |
| INVENTOR(S) | : Shiro Sakai et al. | |

It is certified that error appears in the above-identified patent and that said Letters Patent is hereby corrected as shown below:

On the cover page:

Under section (56) Reference Cited, OTHER PUBLICATIONS, add --Patent Abstract of Japen, publication no. 2000091253A, published March 31, 2000 (1 pg)--.

Column 9 (line 36), replace "50 mm" with --50 n̲m--.

In Claim 1, column 11 (Line 9), replace "($0 \leq x \leq 1$, $0 < y < 0.01$)" with --($0 \leq x \leq 1$, $0 < y \leq 0.01$)--.

In Claim 6, column 11 (Line 8), replace "($0 \leq x \leq 1$, $0 < y < 0.01$)" with --($0 \leq x \leq 1$, $0 < y \leq 0.01$)--.

Signed and Sealed this

Fourteenth Day of November, 2006

JON W. DUDAS
*Director of the United States Patent and Trademark Office*